United States Patent [19]

Pfennings et al.

[11] Patent Number: 4,868,665
[45] Date of Patent: Sep. 19, 1989

[54] CHARGE-COUPLED DEVICE WITH VARIBLE STORAGE CAPACITY AND CONSTANT CLOCK FREQUENCY

[75] Inventors: Leonardus C. M. G. Pfennings; Frits A. Steenhof, both of Eindhoven, Netherlands

[73] Assignee: U.S. Philips Corp., New York, N.Y.

[21] Appl. No.: 183,869

[22] Filed: Apr. 19, 1988

[30] Foreign Application Priority Data

May 1, 1987 [NL] Netherlands ............ 8701030

[51] Int. Cl.⁴ .................................. H04N 3/14
[52] U.S. Cl. ..................... 358/213.26; 358/213.25
[58] Field of Search ................ 358/213.25, 213.26, 358/213.22, 909

[56] References Cited

U.S. PATENT DOCUMENTS

| | | | |
|---|---|---|---|
| 4,426,664 | 1/1984 | Nagumo et al. | 358/213.26 |
| 4,656,520 | 4/1987 | Hurst | 358/213.25 |
| 4,731,656 | 3/1988 | Dischert et al. | 358/213.26 |

Primary Examiner—Jin F. Ng
Assistant Examiner—Stephen Brinich
Attorney, Agent, or Firm—Steven R. Biren

[57] ABSTRACT

In a one-electrode/bit SPS CCD memory, a capacity reduction can be obtained by phase shift of one or more clock voltages. For an n-phase system with N groups of n electrodes, the storage capacity can thus be reduced stepwise from at most $N(n-1)$ bits to $N(n-2)$ bits, etc. The stay time of the bits stored is reduced by a corresponding factor, as a result of which the clock frequency in the series registers need not be changed. By this reduction, the memory is more particularly suitable for storing television pictures both in the 625 lines system and in the 525 lines system.

5 Claims, 3 Drawing Sheets

CHARGE-COUPLED DEVICE WITH VARIBLE STORAGE CAPACITY AND CONSTANT CLOCK FREQUENCY

BACKGROUND OF THE INVENTION

The invention relates to a charge-coupled device of the n-phase- one-electrode/bit or ripple phase type having a variable storage capacity comprising a semiconductor body having a charge transport channel defined at or near a surface of the semiconductor body and a system of clock electrodes on the surface, which can be connected to clock voltage means such that in a row of n successive electrodes an adjustable number of adjacent storage sites in which information is stored and which alternate with empty sites in which no information is stored can be induced.

Such a device is known inter alia from the European Patent Application No. 0099931 laid open to public inspection.

The invention is more particularly, but not exclusively of importance for memory devices having an SPS (Series/Parallel/Series) configuration. Such memories may advantageously be used, for example, for storing television pictures, in which event the information is introduced in series and after a given storage time must be read out again in series, as is described inter alia in the article "A digital field memory television reciever" by M. J. M. Pelgrom et al in I.E.E.E. Transactions on Consumer Electronics, Vol. CE-29, No. 3, August 1983, p. 242/248. The CCD memory is attractive for these and also other applications because of the very high information density due to the fact that per bit only one electrode is required. As compared with other memories, such as random access memories (RAM's), these CCD memories may be comparatively small with regard to the chip surface.

The aforementioned European Patent Application No. 0,099,931 discloses a CCD memory having a variable storage capacity, i.e. a memory in which the number of bits that can be stored is adjustable. The need for such a variable memory arises inter alia in the aforementioned television applications when the memory used must be suitable both for the 625 line system and for the 525 line system. With the use of a conventional CCD memory having a nonvariable capacity, the storage capacity will be adapted to the 625 lines system, which means that for the 525 lines system a number of lines of the memory will not contain useful information. With reference to FIGS. 14 and 15, EP-A 0,099,931 describes a 6-phase one-electrode/bit CCD, which, while maintaining the one-electrode/bit mode of operation, is shortened in that per group of six electrodes instead of the usual single site two empty sites are formed, as a result of which the storage capacity is reduced by a factor 4/5.

A disadvantage of the method described above is that the storage information traverses the memory at a two times higher speed because the empty sites are displaced simultaneously with respect to the embodiment shown in FIGS. 4-6, in which the maximum capacity of the memory is utilized. The frequency of the series registers therefore has to be doubled. Essentially, the storage time in this known device consequently is connected disproportionately with the storage capacity. Frequently, it is desirable to keep the clock frequency substantially constant both in the parallel section and in the series registers.

SUMMARY OF THE INVENTION

The invention has inter alia for its object to provide a one-electrode/bit CCD, in which the storage capacity can be varied in a simple manner without the clock frequencies being varied at the same time and in which the passage time varies proportionately with the storage capacity.

A charge-coupled device according to the invention is characterized in that means are provided by which in a group of n successive electrodes the clock voltage applied to at least one of the electrodes can be shifted in phase with unchanged frequency of this clock voltage and the clock voltages applied to the remaining electrodes of the group with respect to the clock voltage applied to an adjacent electrode, as a result of which the instant of charge transport in this part of the device is determined by the phase of the said one clock voltage.

As will appear from the description of the Figures, due to the phase shift an additional empty site can be formed in each group of n storage sites. The storage capacity per n storage sites then decreases from (n-1) to (n-2). The passage time of each charge packet varies accordingly when the clock frequency remains unchanged so that the overall time of stay in the memory decreases proportionally to the storage capacity. The clock frequency in the series registers can be kept constant.

A simple embodiment, which has inter alia the advantage that no separate clocks are required for varying the storage capacity, is characterized in that switching means are provided, by means of which in each group of n successive electrodes at least one electrode can be connected to a first point, to which the same clock voltage is applied as to another electrode within this group, and to a second point to which a clock voltage is applied, only one empty site being formed in the row.

BRIEF DESCRIPTION OF THE DRAWING

The invention will be described more fully with reference to an embodiment and the accompanying diagrammatic drawing, in which.

DESCRIPTION OF THE PREFERRED EMBODIMENTS

Figure 1:
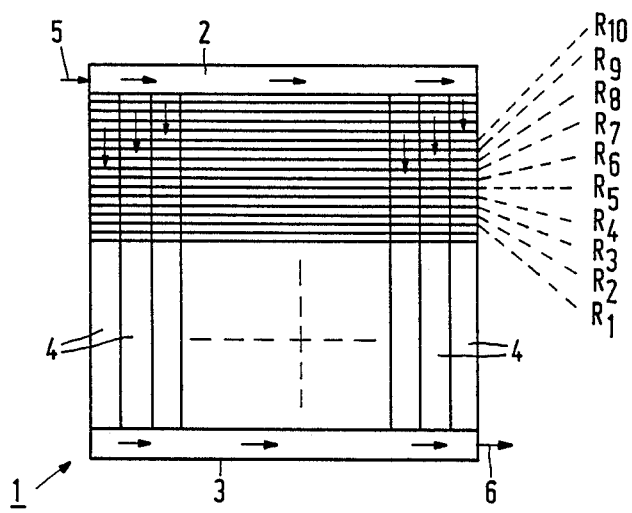
FIG. 1 shows the circuit diagram of a 10-phase one-electrode/bit SPS memory.

FIG. 1 shows a diagrammatic plan view of an SPS memory 1 comprising a charge-coupled device according to the invention. The device comprises a series input register 2, a series output register 3 and a parallel section located between the input register 2 and the output register 3 and comprising a large number of adjacent registers 4. The transport direction indicated by arrows in the registers is horizontal in the series input and output registers (from the left to the right) and vertical in the parallel section (from top to bottom). Information can be introduced at the input of the series register 2, which is indicated by the arrow 5. When the series register 2 is full, the information is transferred in parallel to the parallel section 4, after which the input register can be filled again. The information stored in the parallel section 4 can be transported from top to bottom and can be transferred at the bottom to the series register 3. The output signals can be read out at the output 6.

Figure 2:
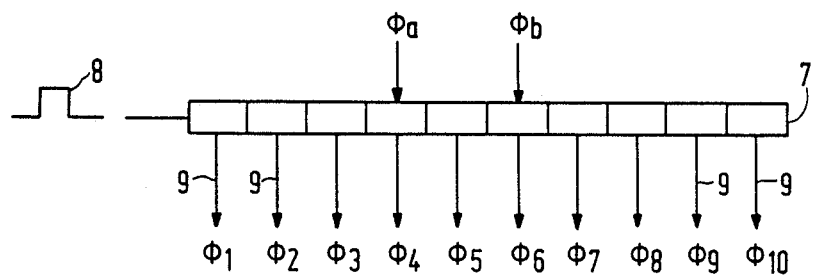
FIG. 2 shows the circuit diagram of a clock generator to be used in the SPS memory shown in FIG. 1.

The parallel registers 4 are constituted by n-phase one-electrode/bit charge-coupled devices. In the present embodiment, n is equal to 10, but it will be appreciated without further explanation that n may also have another value. For this purpose, the parallel section 4 is provided with an electrode system having electrodes which are divided into groups of ten successive electrodes. In FIG. 1 one group provided with the designations R1, R2, R3, ... R10 is shown diagrammatically. Through clock lines not shown in the drawing for the sake of clarity, the clock voltage $\phi_i$ can be applied to the electrodes $R_i$. These clock voltages can be generated in a usual manner, for example by means of a shift register 7, as shown diagrammatically in FIG. 2. A pulsatory input signal 8 is supplied to the input of the shift register 7 and is transported through the shift register under the control of one or more clocks $\phi_a$, $\phi_b$ etc. The clock voltages $\phi_1$, $\phi_2$, $\phi_3$ ... $\phi_{10}$ applied to the clock electrodes of the parallel registers 4 can be derived at the outputs 9 of the shift register 7.

The shift registers 2 and 3 can be constituted by conventional 2-, 3- or 4-phase charge-coupled devices. For the sake of clarity, the electrodes of these registers are not shown in FIG. 1.

Figure 3:
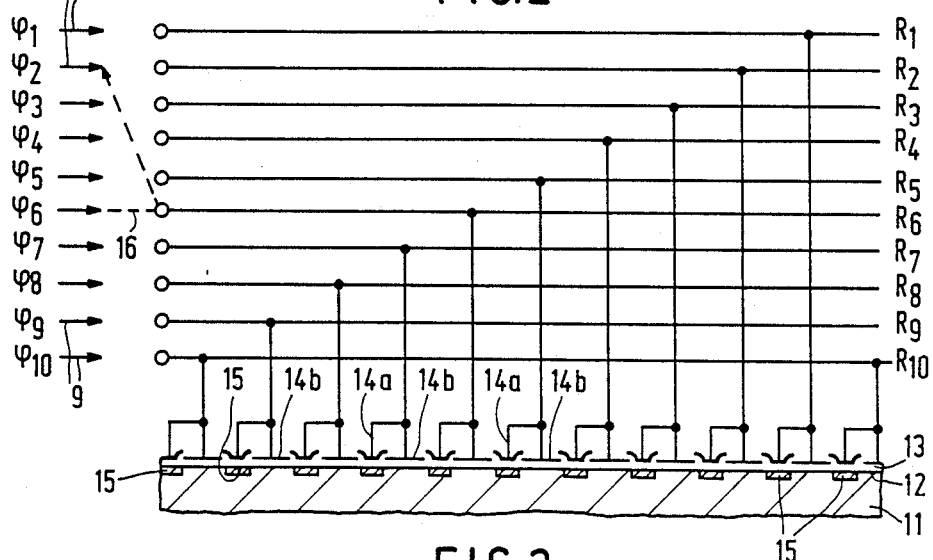
FIG. 3 shows in cross-section a part of such an SPS memory according to the invention.

FIG. 3 shows a sectional view in the longitudinal direction of a part of one of the parallel registers 4. The device is in the form of an n-channel surface CCD and comprises a semiconductor body 11, which is entirely or at least in part of the p-type. The surface 12 is provided with a thin insulating layer 13 of, for example, silicon oxide, which constitutes the gate dielectric. The electrode system comprises a series of clock electrodes 14, which each comprise a transfer part 14a and a storage part 14b. The electrodes 14 can be manufactured in known manner in a two-layer overlapping wiring, in which event, for example, the transfer parts 14b are made of a polycrystalline silicon layer and the transfer parts 14a are made of a second polycrystalline silicon layer or of an aluminum layer. Each transfer electrode is conductively connected to the righthand storage electrode. In order to obtain a potential barrier below the transfer parts 14a, zones 15 can be provided in the semiconductor body having the same conductivity type as and a higher doping than the surrounding parts of the semiconductor body 11. Instead of zones 15, other means generating a potential barrier, such as, for example, thicker oxide below the transfer electrodes 14a or separate voltage sources, may also be used.

FIG. 3 shows also diagrammatically the clock lines, through which the clock voltages are supplied to the electrodes, as well as the outputs 9 of the shift register supplying the clock voltages $\phi_1$, $\phi_2$, ... $\phi_{10}$. The clock lines themselves will also be designated by $R_1$, $R_2$, $R_3$ ... etc. for the sake of simplicity. In the drawing, in which the charge transport takes place from the left to the right, the electrode 14 of the lefthand side is conductively connected to $R_{10}$, the next electrode to $R_9$, the next electrode to $R_8$, etc. The last electrode but one shown is connected to $R_1$, the next electrode again to $R_{10}$, etc. In order to vary the storage capacity, at least one clock line, in the present embodiment the clock line $R_6$, is connected to a switch 15 shown only diagrammatically, by means of which $R_6$ can be connected to either ($\phi_6$) or another terminal 9, in the present embodiment ($\phi_2$).

In the case in which the maximum storage capacity of the device should be utilized, for example with the use as frame memory in a system having 625 picture lines, the switch 16 is adjusted to the position in which the clock $\phi_6$ is applied to the clock line $R_6$ and to the electrodes connected thereto.

Figure 4:
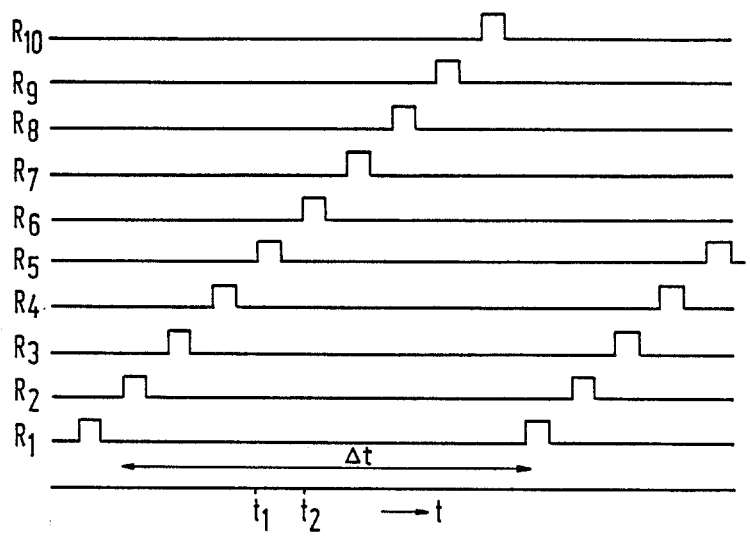
FIGS. 4 and 5 show clock voltages applied to the device shown in FIG. 3 during operation.
Figure 6:
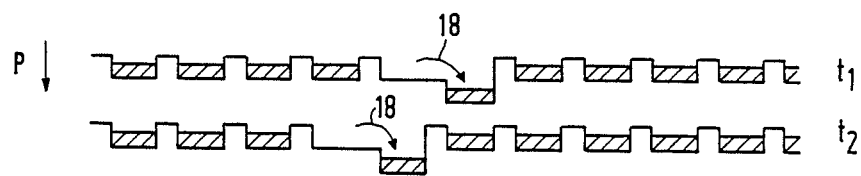
FIGS. 6 and 7 show potential distributions occurring in the device shown in FIG. 3 during operation.

The device is then operated in the usual one-electrode/bit mode. FIG. 4 shows the clock voltages applied to the electrodes (clock lines) $R_1, R_2 ... R_{10}$ as a function of the time t. As appears from FIG. 4, the electrodes are for most of the time at a low rest level which is chosen so that in this condition charge can be stored below the electrodes. Only during charge transport, the potential varies due to a voltage pulse moving at a regular speed along the row of electrodes. For explanation of the operation, FIG. 6 shows the potential distribution as occurring in the part shown in FIG. 3 for two instants $t_1$ and $t_2$. The potential barriers correspond to the transfer electrodes 14a, while the potential wells correspond to the storage parts 14b. The shaded area in FIG. 6 represents electrical charge, i.e. information. In the condition in which the maximum storage capacity of the memory is utilized, nine charge packets and a single empty site occur for each group of ten electrodes 14. Before the instant $t_1$, this empty site was situated below $R_5$. At $t_1$ (cf. also FIG. 4), the voltage pulse is applied to $R_5$, as a result of which the potential well (and barrier) below $R_5$ becomes deeper. The charge stored below the adjacent electrode 14 ($R_6$) can now flow on to the potential well below $R_5$. This is shown diagrammatically in FIG. 6 ($t_1$) by the arrow 18. The site below $R_5$ is now filled again with information and the empty site, which was initially situated below $R_5$, has shifted to the right below $R_6$. In the analogous manner, the charge packet stored below $R_7$ is shifted at $t_2$ to the right when the voltage pulse is applied to $R_6$. The empty site was then shifted again by an electrode further to the left.

The overall period in which a charge packet (bit) is stored in the memory or at least in the parallel section thereof amounts to the number of storage sites in the parallel section multiplied by the duration for which a bit is stored in one given storage site. This time duration is indicated in FIG. 4 by $\Delta t$ and is equal to the time duration between a pulse at the electrode $R_i$ and the subsequent pulse at the electrode $R_i$-1. It can be readily verified that in an n-phase system the passage time for a charge packet through a group of n electrodes is equal to (n-1)T, where T is the inverse value of the clock frequency of $R_i$.

Figure 5:
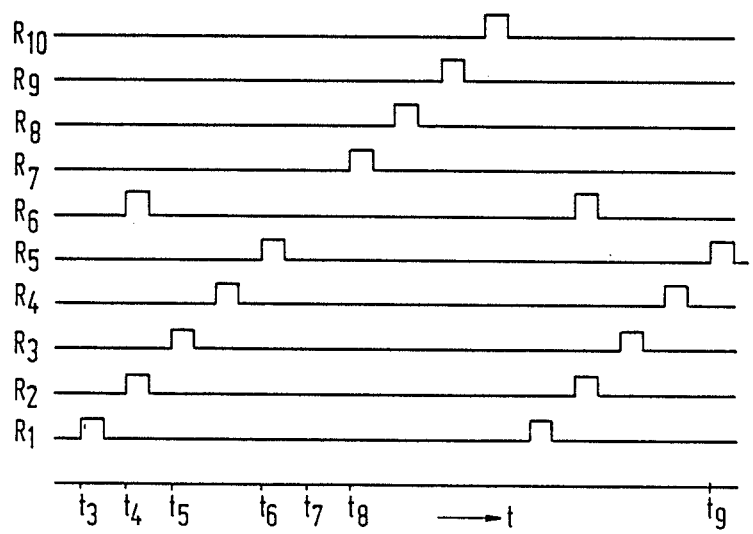
Figure 7:
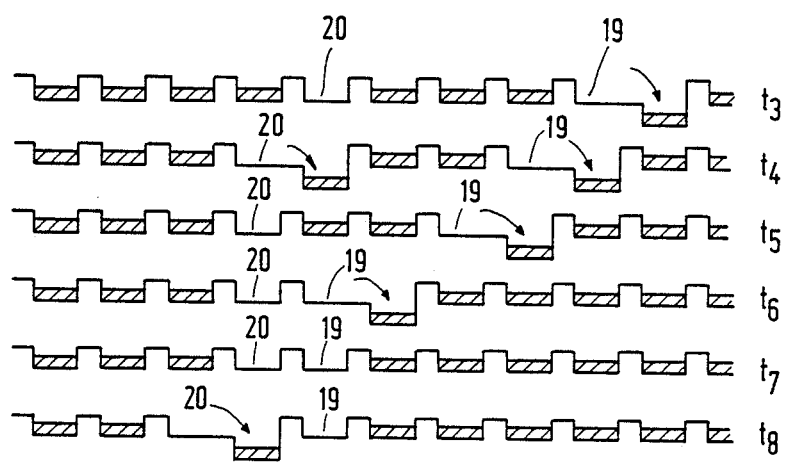

In the case in which the storage capacity has to be reduced, for example with the use as a frame memory in a 525 line television system, the switch 16 can be changed over. The clock line $R_6$ is then connected to $\phi_2$. FIG. 5 shows the clock voltages applied in this situation to the clock lines $R_1 - R_{10}$, it being assumed that the output signals $\phi_1$, $\phi_2$, $\phi_3$ ... $\phi_{10}$ of the shift register 7 do not vary. In FIG. 7, the associated potential profiles are shown at six different instants $t_3 - t_8$. As indicated in FIG. 7, two empty sites 19 and 20 instead of a single empty site are present within a group of ten electrodes $R_1 - R_{10}$. At the instant $t_3$, a positive voltage pulse is applied to $R_1$, as a result of which the empty site 19 below $R_1$ is shifted to the left over a distance of one electrode and the charge packet stored below $R_2$ is shifted over a distance of one electrode to the right and is stored in the potential well below $R_1$. The empty site 20 below $R_6$, to which the clock $\phi_2$ is applied, is not shifted in the meantime. At $t_4$, the positive voltage pulse is applied to $R_2$ and at the same time to $R_6$. The empty sites 19 and 20 are now both shifted over a distance of one electrode to the left. During this step, the charge packets below $R_3$ and $R_7$ are simultaneously shifted to the right. The empty site 20 is then no longer shifted for the time being, while the empty site 19 is shifted at $t_5$ further to the left. The empty site 19 has then arrived below the electrode $R_6$, where at an earlier stage the empty site 19 had been situated. The empty site 19 will not be transported from this instant for the time being. At the instant $t_7$, $R_6$ remains at the low level. The empty sites 19 and 20 are not shifted further so that at this instant no charge transport takes place either. At $t_8$, the positive voltage pulse is applied to $R_7$, as a result of which the empty site 20 (FIG. 7, $t_8$) is shifted to the left and the charge packet below $R_8$ is transported to the right. The transport of the empty site 20 is continued until it has arrived again at a following empty site, after which the empty site 20 is stopped and the said following empty site is shifted.

In order to determine the passage time, the charge packet stored at $t_4$ by the pulse $R_6$ below the electrode $R_6$ can be considered. This charge packet is shifted one site further by the pulse $R_5$ at $t_6$. Under normal conditions, this packet would have been shifted at $t_7$ to $R_6$ and it would only then have been shifted at $t_9$ to $R_5$. The passage time is therefore instead of $(n-1)T$, as was the case in the preceding embodiment, now $(n-2)T$. This means that the passage time has been reduced proportionately with the storage capacity. Due to the fact that in the mode of operation for maximum storage capacity, 9 bits occur for 10 electrodes, and in the mode of operation with reduced capacity 8 bits occur for 10 electrodes, the storage capacity has been reduced by a factor 8/9. In the case of a television memory, which should have a maximum storage capacity for the 625 lines system, the reduced storage capacity corresponds to about 561 lines. This reduced capacity renders the memory also suitable for use in the NTSC system with 525 lines. The (still low) excess capacity may be compensated for, if desired, by shifting on the lines not containing useful information at a higher speed.

In addition to PAL and NTSC applications, a CCD memory may also be used for many other applications, in which other reduction factors are desired. By the use of two or more switches 16, where a third clock line $R_i$ may be connected to the clock voltage $\phi_j$, j being unequal to i, a further reduction of the storage capacity may be obtained.

It will be appreciated that the invention is not limited to the embodiments described herein, but that many further variations are possible for those skilled in the art without departing from the scope of the invention. For example, the invention may be used, not only in SPS memories, but in all CCD's of the one-electrode/bit type. In addition to the clock generator with the shift register 7, other known clock voltage generators may also be used. The invention may also be used in devices in which no means 15 forming a potential barrier are present and the transfer electrodes 14a are not connected to the storage electrodes 14b, but are driven by separate clock voltages.

What is claimed is:

1. A charge-coupled device of the n-phase one-electrode/bit ripple phase type having a variable storage capacity, comprising a semiconductor body having a charge transport channel defined adjacent a surface of the semiconductor body and a system of clock electrodes on the surface which can be connected to clock voltage means, by which in a row of n electrodes an adjustable number of adjacent storage sites is induced in which information is stored and which alternate with induced empty sites in which no information is stored, characterized in that means are provided by which in a group of n successive electrodes the clock voltage applied to at least one of the electrodes can be shifted in phase with the frequency of said clock voltage and the clock voltages applied to the remaining electrodes of the group remaining constant with respect to the clock voltage applied to an adjacent electrode, as a result of which the instant of charge transport in this part of the device is determined by the phase of said clock voltage which is shifted in phase.

2. A charge-coupled device as claimed in claim 1, characterized in that switching means are provided, by which in each group of n successive electrodes at least one electrode can be connected to a first point to which the same clock voltage is applied as to another clock electrode within each said group and to a second point to which clock voltage is applied, only one empty site thereby being formed in the row.

3. A charge-coupled device as claimed in claim 2, characterized in that at least a third electrode is situated between said electrodes receiving the same clock voltage.

4. A charge-coupled device as claimed in claim 1, 2 or 3, characterized in that the charge transport channel with the system of electrodes forms part of the parallel section of a charge-coupled memory device of the SPS type.

5. A charge-coupled device as claimed in claim 1, 2 or 3 of the preceding claims, characterized in that the device is intended for the storage of picture information in display arrangements of the 625 line system and the 525 line system.

* * * * *